(12) United States Patent
Kim et al.

(10) Patent No.: US 9,748,402 B2
(45) Date of Patent: Aug. 29, 2017

(54) SEMICONDUCTOR ELEMENT AND ORGANIC LIGHT EMITTING DISPLAY DEVICE HAVING A SEMICONDUCTOR ELEMENT

(71) Applicant: SAMSUNG DISPLAY CO., LTD., Yongin, Gyeonggi-Do (KR)

(72) Inventors: Jung-Hwa Kim, Gunpo-si (KR); Kwang-Suk Kim, Suwon-si (KR); Il-Jeong Lee, Seoul (KR)

(73) Assignee: Samsung Display Co., Ltd., Yongin-si (KR)

( * ) Notice: Subject to any disclaimer, the term of this patent is extended or adjusted under 35 U.S.C. 154(b) by 22 days.

(21) Appl. No.: 14/811,616

(22) Filed: Jul. 28, 2015

(65) Prior Publication Data

US 2016/0225837 A1    Aug. 4, 2016

(30) Foreign Application Priority Data

Feb. 4, 2015 (KR) .......................... 10-2015-0017313

(51) Int. Cl.
*H01L 29/786* (2006.01)
*H01L 51/05* (2006.01)
*H01L 51/10* (2006.01)

(52) U.S. Cl.
CPC ...... *H01L 29/7869* (2013.01); *H01L 51/0545* (2013.01); *H01L 51/102* (2013.01)

(58) Field of Classification Search
CPC ............. H01L 51/0545; H01L 51/0036; H01L 51/0541; H01L 51/5012
See application file for complete search history.

(56) References Cited

U.S. PATENT DOCUMENTS

| 8,742,425 B2 * | 6/2014 | Kim .................... H01L 27/1255 |
| | | 257/59 |
| 9,240,486 B2 * | 1/2016 | Cho ................... H01L 29/78618 |
| 9,245,937 B2 * | 1/2016 | Kim .................... H01L 29/7869 |

FOREIGN PATENT DOCUMENTS

| KR | 2000-0028721 A | 5/2000 |
| KR | 10-2009-0098033 A | 9/2009 |
| KR | 10-2010-0070991 A | 6/2010 |
| KR | 10-2014-0074404 A | 6/2014 |

* cited by examiner

*Primary Examiner* — Quoc Hoang
(74) *Attorney, Agent, or Firm* — Lewis Roca Rothgerber Christie LLP (57) ABSTRACT

A semiconductor element includes a substrate, a gate electrode, an active layer, a contact layer, a first electrode, and a second electrode. The gate electrode is disposed on the substrate. The gate insulation layer is disposed on the gate electrode. The active layer is disposed on the gate insulation layer, and includes a first end portion and a second end portion that is opposite the first end portion. The contact layer overlaps the second end portion of the active layer. The first electrode is in contact with the first end portion. The second electrode is spaced apart from the first electrode, and is in contact with the contact layer.

20 Claims, 6 Drawing Sheets

SEMICONDUCTOR ELEMENT AND ORGANIC LIGHT EMITTING DISPLAY DEVICE HAVING A SEMICONDUCTOR ELEMENT

CROSS-REFERENCE TO RELATED APPLICATION

This application claims priority under 35 USC §119 to and the benefit of Korean Patent Applications No. 10-2015-0017313, filed on Feb. 4, 2015 in the Korean Intellectual Property Office (KIPO), the contents of which are incorporated herein in its entirety by reference.

BACKGROUND

1. Field

The present disclosure is related to semiconductor elements and an organic light emitting display device having a semiconductor element.

2. Description of the Related Art

A conventional semiconductor element having a bottom gate configuration generally includes a gate electrode disposed on a substrate, a gate insulation layer disposed on the gate electrode, an active layer disposed on the gate insulation layer, an etching stop layer disposed on the active layer, and a source electrode and a drain electrode disposed on the etching stop layer. The source electrode and the drain electrode may contact a source region and a drain region of the active layer.

In the conventional semiconductor element of the bottom gate configuration, the etching stop layer may include a first opening and a second opening. Each of the source and drain electrodes may contact the active layer through the first and second openings. For example, the openings may be formed in the etching stop layer via the dry or wet etching processes. In this case, since electrons are trapped in a contact surface where the source electrode to which a high power supply voltage is applied contacts the active layer, a threshold voltage (Vth) of the semiconductor element may be changed. Accordingly, the semiconductor element may have degraded electrical characteristics such as the increase of the threshold voltage distribution, the decrease of the driving current, etc. Particularly, when the conventional semiconductor element includes an active layer having an oxide semiconductor, the conventional semiconductor element may be relatively sensitive to the change of the electrical characteristics, and thus the conventional semiconductor element may malfunction. Such a degraded semiconductor element may not be properly employed in recent display devices such as liquid crystal display (LCD) devices, organic light emitting display (OLED) devices, etc.

SUMMARY

Some example embodiments provide a semiconductor element including a contact layer.

Some example embodiments provide an organic light emitting display device having a semiconductor element including a contact layer.

Embodiments of the present inventive concept relate to semiconductor elements including a contact layer and an organic light emitting display device having a semiconductor element including a contact layer.

According to an aspect, a semiconductor element, may include: a substrate; a gate electrode on the substrate; a gate insulation layer on the gate electrode; an active layer on the gate insulation layer, the active layer including a first end portion and a second end portion that is opposite the first end portion; a contact layer overlapping the second end portion of the active layer; a first electrode contacting the first end portion; and a second electrode spaced from the first electrode, the second electrode contacting the contact layer.

The second electrode may be electrically connected to the active layer through the contact layer.

The active layer may include an oxide semiconductor layer.

The contact layer may include one or more conductive materials.

The semiconductor element may further include an etching stop layer on the gate insulation layer, wherein the etching stop layer has: a first opening at the first end portion of the active layer; and a second opening at the contact layer.

The first electrode may contact the active layer through the first opening, and the second electrode may contact the contact layer through the second opening.

At least a portion of the contact layer may be interposed between the active layer and the etching stop layer, and the contact layer may be electrically connected with the active layer.

At least a portion of the contact layer may be interposed between the active layer and the gate insulation layer, and the contact layer may be electrically connected with the active layer.

A high power supply voltage may be applied to the second electrode, and the high power supply voltage applied to the second electrode may be provided to the first electrode through the contact layer and the active layer.

According to another aspect, a semiconductor element, may include: a substrate; a gate electrode on the substrate; a gate insulation layer on the gate electrode; an active layer on the gate insulation layer, the active layer comprising a first end portion and a second end portion that is opposite the first end portion; a first contact layer overlapping the first end portion of the active layer; a second contact layer overlapping the second end portion of the active layer; a first electrode contacting the first contact layer; and a second electrode spaced from the first electrode, the second electrode contacting the second contact layer.

The first electrode may be electrically connected to the active layer through the first contact layer, and the second electrode may be electrically connected to the active layer through the second contact layer.

The active layer may include an oxide semiconductor, and the first and second contact layers may include one or more conductive materials.

The semiconductor element may further include an etching stop layer on the gate insulation layer, wherein the etching stop layer has: a first opening at the first end portion of the active layer; and a second opening at the second end portion of the active layer, and wherein the first electrode contacts the first contact layer through the first opening, and the second electrode contacts the second contact layer through the second opening.

Each of at least a portion of the first and second contact layers may be interposed between the active layer and the gate insulation layer, and the first and second contact layers may be electrically connected with the active layer.

According to another aspect, an organic light emitting display device may include: a semiconductor element including: a substrate; a gate electrode on the substrate; a gate insulation layer on the gate electrode; an active layer on the gate insulation layer, the active layer comprising a first end portion and a second end portion that is opposite the first end portion; a contact layer overlapping the second end portion of the active layer; a first electrode contacting the first end portion; and a second electrode spaced from the first electrode, the second electrode contacting the contact layer, a lower electrode electrically connected to the first electrode; a light emitting layer on the lower electrode; and an upper electrode on the light emitting layer.

The second electrode may be electrically connected to the active layer through the contact layer, and wherein the active layer may include an oxide semiconductor, and the contact layer may include conductive materials.

The organic light emitting display device may further include an etching stop layer on the gate insulation layer, wherein the etching stop layer has: a first opening at the first end portion of the active layer; and a second opening at the contact layer, and wherein the first electrode contacts the active layer through the first opening, and the second electrode contacts the contacts layer through the second opening.

The organic light emitting display device may further include a planarization layer on the semiconductor element, wherein the planarization layer has a third opening that exposes at least a portion of the first electrode, and the lower electrode contacts the first electrode through the third opening.

At least a portion of the contact layer may be interposed between the active layer and the gate insulation layer, and the contact layer may be electrically connected with the active layer.

A high power supply voltage may be applied to the second electrode, and the high power supply voltage applied to the second electrode may be provided to the lower electrode through the contact layer, the active layer, and the first electrode.

BRIEF DESCRIPTION OF THE DRAWINGS

Example embodiments can be understood in more detail from the following description taken in conjunction with the accompanying drawings, in which.

DETAILED DESCRIPTION

Hereinafter, embodiments of the present inventive concept will be explained in detail with reference to the accompanying drawings, in which like reference numbers refer to like elements throughout. The present invention, however, may be embodied in various different forms, and should not be construed as being limited to only the illustrated embodiments herein. Rather, these embodiments are provided as examples so that this disclosure will be thorough and complete, and will fully convey the aspects and features of the present invention to those skilled in the art. Accordingly, processes, elements, and techniques that are not necessary to those having ordinary skill in the art for a complete understanding of the aspects and features of the present invention may not be described. Unless otherwise noted, like reference numerals denote like elements throughout the attached drawings and the written description, and thus, descriptions thereof will not be repeated. In the drawings, the relative sizes of elements, layers, and regions may be exaggerated for clarity.

It will be understood that, although the terms "first," "second," "third," etc., may be used herein to describe various elements, components, regions, layers and/or sections, these elements, components, regions, layers and/or sections should not be limited by these terms. These terms are used to distinguish one element, component, region, layer or section from another element, component, region, layer or section. Thus, a first element, component, region, layer or section described below could be termed a second element, component, region, layer or section, without departing from the spirit and scope of the present invention.

Spatially relative terms, such as "beneath," "below," "lower," "under," "above," "upper," and the like, may be used herein for ease of explanation to describe one element or feature's relationship to another element(s) or feature(s) as illustrated in the figures. It will be understood that the spatially relative terms are intended to encompass different orientations of the device in use or in operation, in addition to the orientation depicted in the figures. For example, if the device in the figures is turned over, elements described as "below" or "beneath" or "under" other elements or features would then be oriented "above" the other elements or features. Thus, the example terms "below" and "under" can encompass both an orientation of above and below. The device may be otherwise oriented (e.g., rotated 90 degrees or at other orientations) and the spatially relative descriptors used herein should be interpreted accordingly.

It will be understood that when an element or layer is referred to as being "on," "connected to," "connected with" or "coupled to" another element or layer, it can be directly on, connected to, connected with, or coupled to the other element or layer, or one or more intervening elements or layers may be present. In addition, it will also be understood that when an element or layer is referred to as being "between" two elements or layers, it can be the only element or layer between the two elements or layers, or one or more intervening elements or layers may also be present.

The terminology used herein is for the purpose of describing particular embodiments only and is not intended to be limiting of the present invention. As used herein, the singular forms "a" and "an" are intended to include the plural forms as well, unless the context clearly indicates otherwise. It will be further understood that the terms "comprises," "comprising," "includes," and "including," when used in this specification, specify the presence of the stated features, integers, steps, operations, elements, and/or components, but do not preclude the presence or addition of one or more other features, integers, steps, operations, elements, components, and/or groups thereof. As used herein, the term "and/or" includes any and all combinations of one or more of the associated listed items. Expressions such as "at least one of," when preceding a list of elements, modify the entire list of elements and do not modify the individual elements of the list.

As used herein, the term "substantially," "about," and similar terms are used as terms of approximation and not as terms of degree, and are intended to account for the inherent deviations in measured or calculated values that would be recognized by those of ordinary skill in the art. Further, the use of "may" when describing embodiments of the present invention refers to "one or more embodiments of the present invention." As used herein, the terms "use," "using," and "used" may be considered synonymous with the terms "utilize," "utilizing," and "utilized," respectively. Also, the term "exemplary" is intended to refer to an example or illustration.

The electronic or electric devices and components and/or any other relevant devices or components according to embodiments of the present invention described herein may be implemented utilizing any suitable hardware, firmware (e.g. an application-specific integrated circuit), software, or a combination of software, firmware, and hardware. For example, the various components of these devices may be formed on one integrated circuit (IC) chip or on separate IC chips. Further, the various components of these devices may be implemented on a flexible printed circuit film, a tape carrier package (TCP), a printed circuit board (PCB), or the like. Further, the various components of these devices may be a process or thread, running on one or more processors, in one or more computing devices, executing computer program instructions and interacting with other system components for performing the various functionalities described herein. The computer program instructions may be stored in a memory which may be implemented in a computing device using a standard memory device, such as, for example, a random access memory (RAM). The computer program instructions may also be stored in other non-transitory computer readable media such as, for example, a CD-ROM, flash drive, or the like. Also, a person of ordinary skill in the art should recognize that the functionality of various computing devices may be combined or integrated into a single computing device, or the functionality of a particular computing device may be distributed across one or more other computing devices without departing from the spirt and scope of the present invention.

Unless otherwise defined, all terms (including technical and scientific terms) used herein have the same meaning as commonly understood by one of ordinary skill in the art to which the present invention belongs. It will be further understood that terms, such as those defined in commonly used dictionaries, should be interpreted as having a meaning that is consistent with their meaning in the context of the relevant art and/or the present specification, and should not be interpreted in an idealized or overly formal sense, unless expressly so defined herein.

Figure 1:
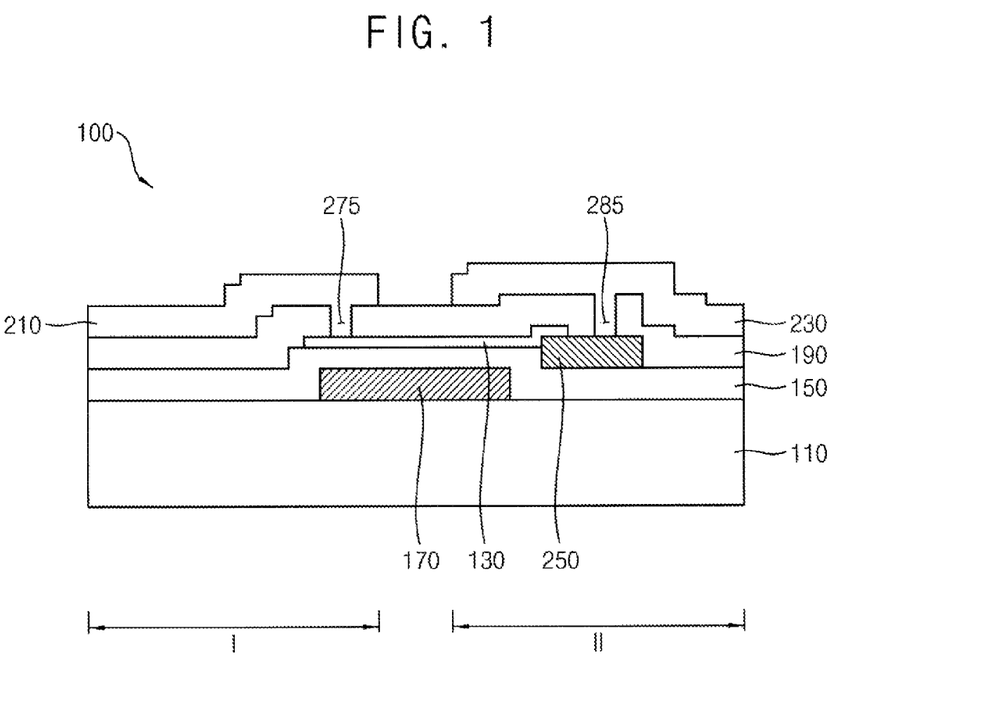
FIG. 1 is a cross-sectional view illustrating a semiconductor element in accordance with example embodiments.

FIG. 1 is a cross-sectional view illustrating a semiconductor element in accordance with example embodiments.

Referring to FIG. 1, a semiconductor element 100 may include a substrate 110, a gate electrode 170, a gate insulation layer 150, a contact layer 250, an active layer 130, an etching stop layer 190, a first electrode 210, a second electrode 230, etc. Here, the etching stop layer 190 may include a first opening 275 and a second opening 285. In example embodiments, the semiconductor element 100 may include a first region I and a second region II. The contact layer 250 may be located in the second region II. The contact layer 250 may contact the second electrode 230 through the second opening 285. The second electrode 230 may be electrically connected to the active layer 130 through the contact layer 250. That is, the second electrode 230 may not directly contact the active layer 130, and an opening may not be located on the active layer 130 in the second region II.

The substrate 110 may include insulating materials. For example, the substrate 110 may include a glass substrate, a transparent plastic substrate, a transparent metal oxide substrate, etc. Although it is not illustrated, at least one buffer layer may be provided on the substrate 110. For example, the buffer layer may include silicon oxide (SiOx), silicon nitride (SiNx), silicon oxynitride (SiOxNy), etc.

The gate electrode 170 may be arranged on the substrate 110. The semiconductor element 100 illustrated in FIG. 1 may have a bottom gate configuration, however, the semiconductor element may have various configurations, for example, a top gate configuration, a dual gate configuration, etc.

The gate electrode 170 may include metal, alloy, metal nitride, conductive metal oxide, transparent conductive material, etc. For example, the gate electrode 170 may include aluminum (Al), an alloy containing aluminum, aluminum nitride (AlNx), silver (Ag), an alloy containing silver, tungsten (W), tungsten nitride (WNx), copper (Cu), an alloy containing copper, nickel (Ni), chrome (Cr), molybdenum (Mo), an alloy containing molybdenum, titanium (Ti), titanium nitride (TiNx), platinum (Pt), tantalum (Ta), tantalum nitride (TaNx), neodymium (Nd), scandium (Sc), strontium ruthenium oxide (SrRuxOy), zinc oxide (ZnOx), indium tin oxide (ITO), tin oxide (SnOx), gallium oxide (GaOx), indium zinc Oxide (IZO), etc. These may be used alone or in a suitable combination thereof.

The gate insulation layer 150 may be arranged on the substrate 110 to substantially cover the gate electrode 170. In example embodiments, the gate insulation layer 150 may cover the gate electrode 170, and may have a substantially uniform thickness along a profile of the gate electrode 170. In some example embodiments, the gate insulation layer 150 may sufficiently cover the gate electrode 170, and have a substantially level surface without a step around the gate electrode 170. The gate insulation layer 150 may include silicon compound, metal oxide, etc. For example, the gate insulation layer 150 may include silicon oxide, silicon nitride, silicon oxynitride, aluminum oxide, tantalum oxide, hafnium oxide, zirconium oxide, titanium oxide, etc.

The contact layer 250 may be located in the second region II on the gate insulation layer 150. In example embodiments, a thickness of the contact layer 250 may be relatively greater than that of the gate insulation layer 150. Alternatively, a thickness of the contact layer 250 may be less than or the same or substantially the same as that of the gate insulation layer 150. Because the contact layer 250 is located in the second region II on the gate insulation layer 150, the second electrode 230 may not directly contact the active layer 130. That is, the second electrode 230 may be electrically connected to the active layer 130 through the contact layer 250, and an opening may not be located in the second region II on the active layer 130.

For example, when an opening is located in the second region II of an active layer including an oxide semiconductor, the second electrode may contact the active layer through the opening. Here, an etching stop layer may have the opening, and the opening may be formed in the second region II of the etching stop layer via dry or wet etching process. In this case, since electrons are trapped in a contact surface where a second electrode to which a high power supply voltage is applied contacts the active layer, a threshold voltage of a semiconductor element may be changed. Accordingly, the semiconductor element may have degraded electrical characteristics such as the increase of the threshold voltage distribution, the decrease of the driving current, etc. Thus, the semiconductor element 100 in accordance with example embodiments may include the contact layer 250 such that the opening is not located in the second region II of the active layer including the oxide semiconductor.

The contact layer 250 may include conductive materials. For example, the contact layer 250 may include Al, an alloy containing aluminum, AlNx, Ag, an alloy containing silver, W, WNx, Cu, an alloy containing copper, Ni, Cr, Mo, an alloy containing molybdenum, Ti, TiNx, Pt, Ta, TaNx, Nd, Sc, SrRuxOy, ZnOx, ITO, SnOx, GaOx, IZO, etc. These may be used alone or in a suitable combination thereof.

The active layer 130 may be arranged on a portion of the contact layer 250 and a portion of the gate insulation layer 150 under which the gate electrode 170 is located. In example embodiments, the active layer 130 may include a first end portion and a second end portion that is opposite to the first end portion. The first end portion may be located in the first region I, and the second end portion may be located in the second region II. Here, the second end portion may overlap at least a portion of the contact layer 250. For example, at least a portion of the contact layer 250 may be interposed between the active layer 130 and the gate insulation layer 150. That is, the active layer 130 may directly contact the contact layer 250. The active layer 130 may include a semiconductor oxide layer such as binary system compound (ABx), ternary system compound (ABxCy) or quaternary system compound (ABxCyDz), which may contain indium, zinc, gallium, tin, titanium, aluminum, hafnium (Hf), zirconium (Zr), magnesium (Mg), etc. For example, the active layer 130 may include zinc oxide (ZnOx), gallium oxide (GaOx), titanium oxide (TiOx), tin oxide (SnOx), indium oxide (InOx), indium-gallium oxide (IGO), indium-zinc oxide (IZO), indium tin oxide (ITO), gallium zinc oxide (GZO), zinc magnesium oxide (ZMO), zinc tin oxide (ZTO), zinc zirconium oxide (ZnZrxOy), indium-gallium-zinc oxide (IGZO), indium-zinc-tin oxide (IZTO), indium-gallium-hafnium oxide (IGHO), tin-aluminum-zinc oxide (TAZO), indium-gallium-tin oxide (IGSO), etc.

The etching stop layer 190 may be arranged on the gate insulation layer 150 to substantially cover the active layer 130 and the contact layer 250. In example embodiments, the etching stop layer 190 may cover the active layer 130 and the contact layer 250, and may be arranged as a substantially uniform thickness along a profile of the active layer 130 and the contact layer 250. Here, the etching stop layer 190 may have the first opening 275 and the second opening 285. The first opening 275 may be located on the first end portion of the active layer 130, and the second opening 285 may be located on the contact layer 250. The first opening 275 may expose a portion of the active layer 130 in the first region I. The second opening 285 may expose a portion of the contact layer 250 in the second region II. In some example embodiments, the etching stop layer 190 may sufficiently cover the active layer 130 and the contact layer 250, and have a substantially level surface without a step around the active layer 130 and the contact layer 250. The etching stop layer 190 may include silicon compound, metal oxide, etc. For example, the etching stop layer 190 may include silicon oxide, silicon nitride, silicon oxynitride, etc.

The first electrode 210 and the second electrode 230 may be spaced apart from each other, and may be arranged on the etching stop layer 190. The first electrode 210 may be located in the first region I. The first electrode 210 may fill the first opening 275, such that the first electrode 210 contacts the first end portion of the active layer 130. In example embodiments, the first electrode 210 may be a drain electrode. The second electrode 230 may be located in the second region II. The second electrode 230 may fill second opening 285, such that the second electrode 230 contacts the contact layer 250. In example embodiments, the second electrode 230 may be a source electrode. Each of the first electrode 210 and the second electrode 230 may include metal, alloy, metal nitride, conductive metal oxide, transparent conductive materials, etc. For example, each of the first electrode 210 and second electrode 230 may include Al, Cu, Mo, Ti, Cr, Ta, W, Nd, Sc, alloys thereof, SrRuxOy, ITO, GaOx, IZO, ZnOx, SnOx, carbon nanotube, etc. The second electrode 230 may be electrically connected to the active layer 130 through the contact layer 250. A high power supply voltage is applied to the second electrode 230, and the high power supply voltage applied to the second electrode 230 may be provided to the first electrode 210 through the contact layer 250 and the active layer 130.

As the semiconductor element 100 in accordance with example embodiments includes the contact layer 250, at least a portion of the contact layer 250 may be interposed between the active layer 130 and the gate insulation layer 150. The second electrode 230 may not directly contact the active layer 130. Thus, the dry or wet etching process may not be performed in the second region II on the active layer 130, and a phenomenon where electrons are trapped may be not generated because an opening is not located in the second region II on the active layer 130. Accordingly, as the semiconductor element 100 includes the contact layer 250, reliability and stability of the semiconductor element 100 may be improved.

FIGS. 2A through 2E are cross-sectional views illustrating a method of manufacturing a semiconductor element in accordance with example embodiments.

Figure 2A:
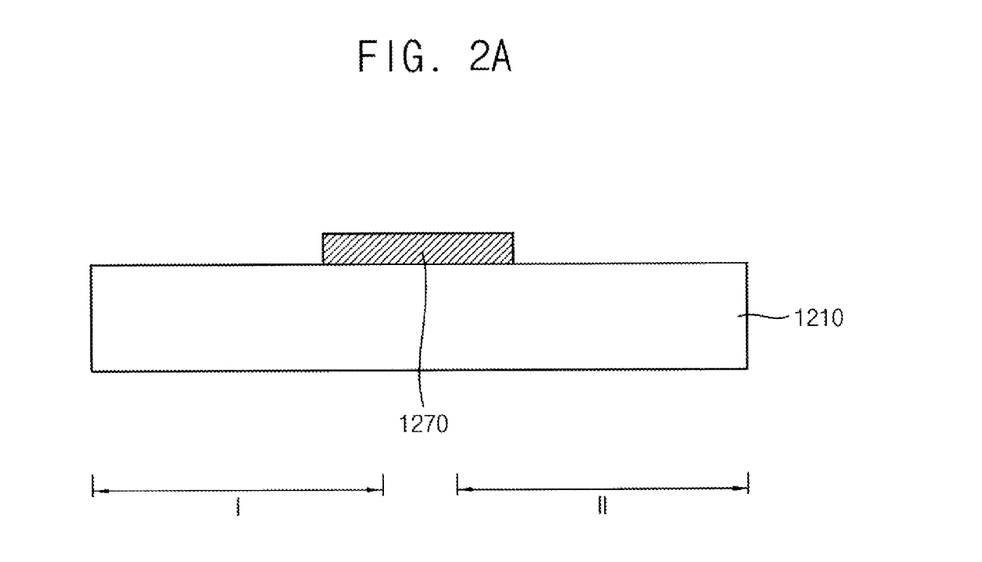
FIGS. 2A through 2E are cross-sectional views illustrating a method of manufacturing a semiconductor element in accordance with example embodiments.

Referring to FIG. 2A, a gate electrode 1270 may be formed on a substrate 1210 that constitutes transparent materials such as glass, transparent plastic, transparent ceramic, etc. The gate electrode 1270 may be formed by a sputtering process, a spray process, a chemical vapor deposition (CVD) process, an atomic layer deposition (ALD) process, a vacuum evaporation process, a printing process, etc. The gate electrode 1270 may be formed by using a metal such as aluminum, tungsten, copper, nickel, chrome, molybdenum, titanium, platinum, tantalum or ruthenium, alloy containing these metals, nitrides of these metals, and/or conductive metal oxide.

Figure 2B:
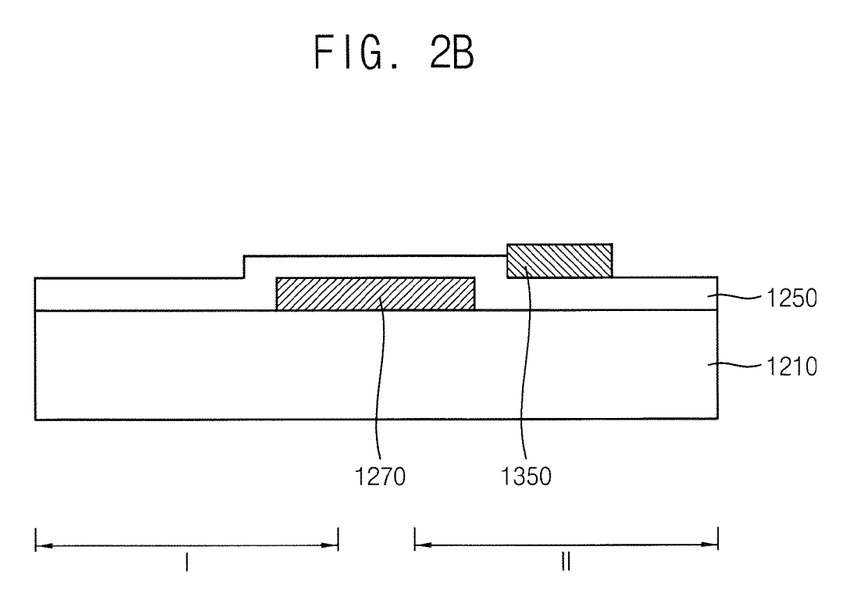

Referring to FIG. 2B, a gate insulation layer 1250 may be formed on the substrate 110 to cover the gate electrode 1270. The gate insulation layer 1250 may be formed by a CVD process, a thermal oxidation process, a plasma enhanced chemical vapor deposition (PECVD) process, a high density plasma-chemical vapor deposition (HDP-CVD) process, etc. The gate insulation layer 1250 may be formed using silicon compound, metal oxide, etc. In example embodiments, the gate insulation layer 1250 may cover the gate electrode 1270, and may be formed along a profile of the gate electrode 1270 to form a substantially uniform thickness.

A contact layer 1350 may be formed in the second region II on the gate insulation layer 1250. The contact layer 1350 may be formed by a sputtering process. In example embodiments, a thickness of the contact layer 1350 may be relatively greater than that of the gate insulation layer 1250. The contact layer 1350 may include conductive materials. For example, the contact layer 1350 may be formed using Al, an alloy containing aluminum, AlNx, Ag, an alloy containing silver, W, WNx, Cu, an alloy containing copper, Ni, Cr, Mo, an alloy containing molybdenum, Ti, TiNx, Pt, Ta, TaNx, Nd, Sc, SrRuxOy, ZnOx, ITO, SnOx, GaOx, IZO, etc.

Figure 2C:
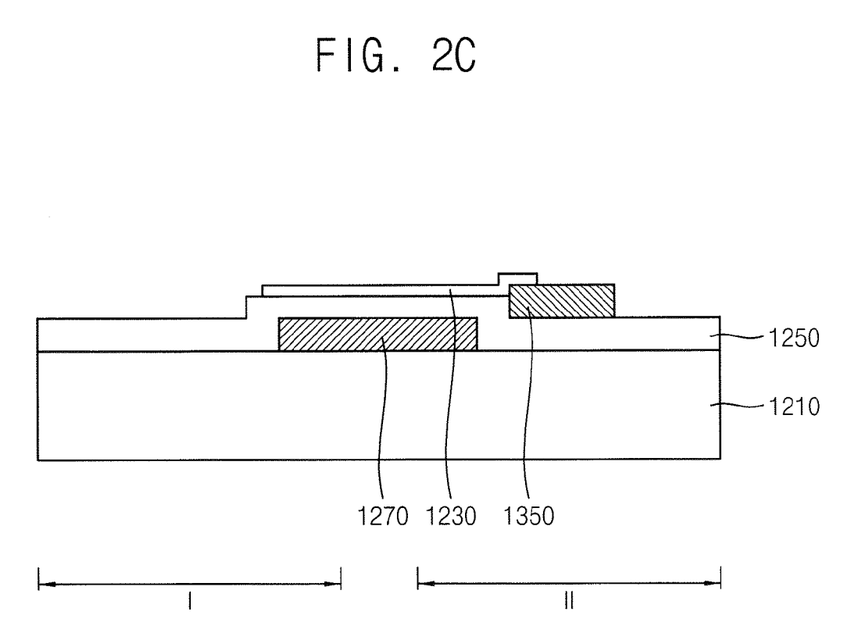

Referring to FIG. 2C, an active layer 1230 may be formed on the gate insulation layer 1250 and a portion of the contact layer 1350. The active layer 1230 may be formed by a sputtering process, a CVD process, a printing process, a spray process, a vacuum evaporation process, an ALD process, a sol-gel process, a PECVD process, etc. The active layer 1230 may be formed on a portion of the contact layer 1350 and a portion of the gate insulation layer 1250 under which the gate electrode 1270 is formed. In example embodiments, the active layer 1230 may include a first end portion and a second end portion that is opposite to the first end portion. The first end portion may be located in the first region I, and the second end portion may be located in the second region II. Here, the second end portion may overlap at least a portion of the contact layer 1350. For example, the contact layer 1350 may be formed such that at least a portion of the contact layer 1350 is interposed between the active layer 1230 and the gate insulation layer 1250. That is, the active layer 1230 may directly contact the contact layer 1350. The active layer 1230 may include a semiconductor oxide layer. For example, the active layer 1230 may be formed using ZnOx, GaOx, TiOx, SnOx, InOx, IGO, IZO, ITO, GZO, ZMO, ZTO, ZnZrxOy, IGZO, IZTO, IGHO, TAZO, IGSO, etc.

Figure 2D:
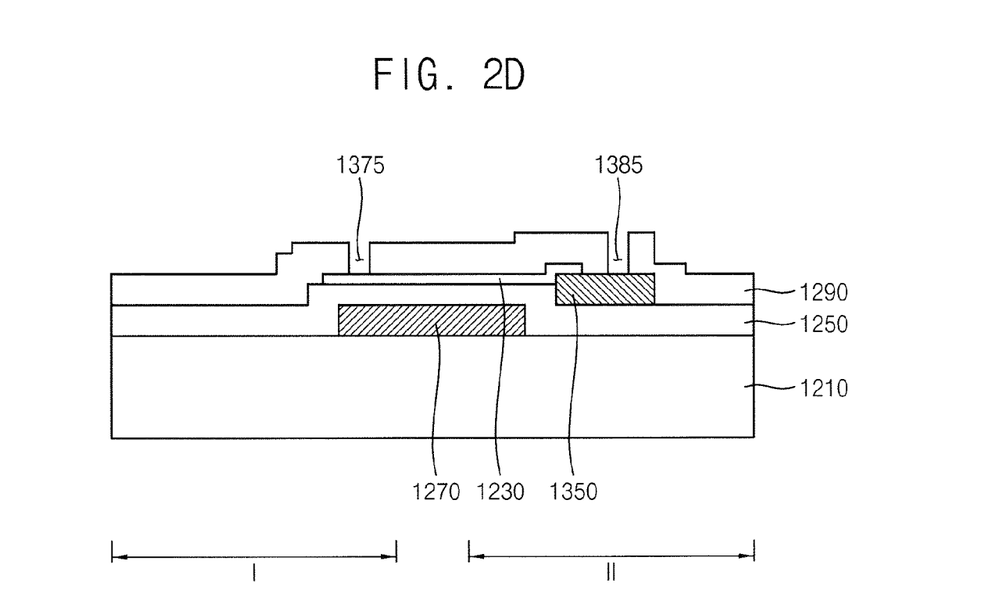

Referring to FIG. 2D, an etching stop layer 1290 may be formed on the gate insulation layer 1250, the active layer 1230, and the contact layer 1350. The etching stop layer 1290 may be formed on the gate insulation layer 1250 to substantially cover the active layer 1230 and the contact layer 1350. In example embodiments, the etching stop layer 1290 may cover the active layer 1230 and the contact layer 1350, and may be formed such that it has a substantially uniform thickness along a profile of the active layer 1230 and the contact layer 1350. Here, first and second openings 1375 and 1385 of the etching stop layer 1290 may be formed by partially removing the etching stop layer 1290. The first opening 1375 may be formed on the first end portion of the active layer 1230, and the second opening 1385 may be formed on the contact layer 1350. The first opening 1375 may expose a portion of the active layer 1230 in the first region I. The second opening 1385 may expose a portion of the contact layer 1350 in the second region II. The etching stop layer 1290 may include silicon compound. For example, the etching stop layer 1290 may be formed using silicon oxide, silicon nitride, silicon oxynitride, etc.

Figure 2E:
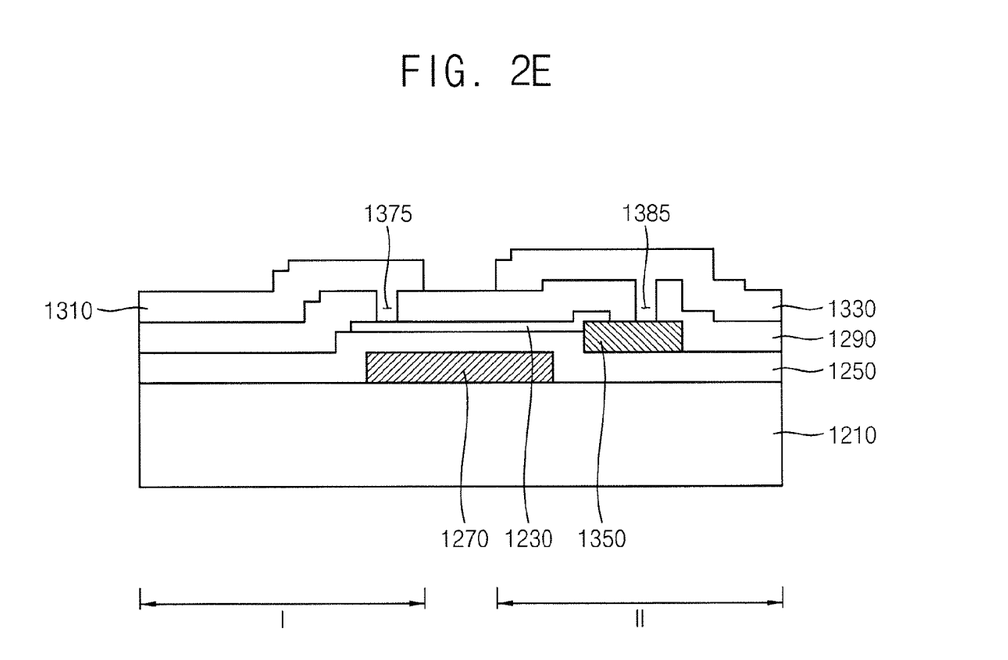

Referring to FIG. 2E, a first electrode 1310 and a second electrode 1330 may be spaced apart from each other, and may be formed on the etching stop layer 1290. Each of the first electrode 1310 and the second electrode 1330 may be formed by a CVD process, a vacuum evaporation process, a sputtering process, a PECVD process, an ALD process, etc. The first electrode 1310 may be formed in the first region I. The first electrode 1310 may fill the first opening 1375, such that the first electrode 1310 contacts the first end portion of the active layer 1230. In example embodiments, the first electrode 1310 may be a drain electrode. The second electrode 1330 may be formed in the second region II. The second electrode 1330 may fill the second opening 1385, such that the second electrode 1330 contacts the contact layer 1350. In example embodiments, the second electrode 1330 may be a source electrode. Each of the first electrode 1310 and the second electrode 1330 may be formed using metal, alloy, metal nitride, conductive metal oxide, transparent conductive materials, etc. The second electrode 1330 may be electrically connected to the active layer 1230 through the contact layer 1350. A high power supply voltage is applied to the second electrode 1330, and the high power supply voltage applied to the second electrode 1330 may be provided to the first electrode 1310 through the contact layer 1350 and the active layer 1230. In example embodiments, at least a portion of the contact layer 1350 may be interposed between the active layer 1230 and the gate insulation layer 1250. The second electrode 1330 may not directly contact the active layer 1230. Thus, the dry or wet etching process may not be performed in the second region II on the active layer 1230, and a phenomenon where electrons are trapped may be not generated because an opening is not located in the second region II on the active layer 1230. Accordingly, there is provided a semiconductor element having a configuration substantially the same as that of a semiconductor element 100 described with reference to FIG. 1. Additionally, to improve reliability and stability of the semiconductor element, an annealing process is performed.

Figure 3:
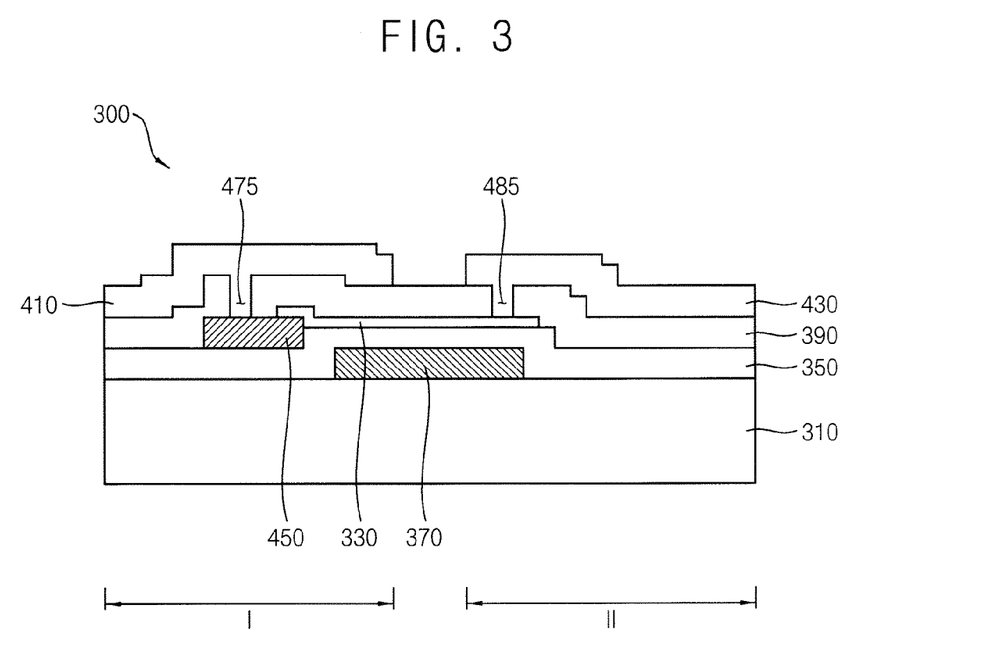
FIG. 3 is a cross-sectional view illustrating a semiconductor element in accordance with some example embodiments.

FIG. 3 is a cross-sectional view illustrating a semiconductor element in accordance with some example embodiments. A semiconductor element 300 illustrated in FIG. 3 may have a configuration that is substantially the same as or similar to that of the semiconductor element 100 described with reference to FIG. 1 except for a position of contact layer 450. Detailed descriptions of elements which are substantially the same as or similar to the elements described with reference to FIG. 1 may be omitted.

Referring to FIG. 3, a semiconductor element 300 may include a substrate 310, a gate electrode 370, a gate insulation layer 350, a contact layer 350, an active layer 330, an etching stop layer 390, a first electrode 410, a second electrode 430, etc. Here, the etching stop layer 390 may include a first opening 475 and a second opening 485. In example embodiments, the semiconductor element 300 may include a first region I and a second region II. The contact layer 450 may be arranged in the first region I. The contact layer 450 may contact the first electrode 410 through the first opening 475. The first electrode 410 may be electrically connected to the active layer 330 through the contact layer 450. That is, the first electrode 410 may not directly contact the active layer 330, and an opening may not be located on the active layer 330 in the first region I.

The contact layer 450 may be located in the first region I on the gate insulation layer 350. In example embodiments, a thickness of the contact layer 450 may be relatively greater than that of the gate insulation layer 350. As the contact layer 450 is located in the first region I on the gate insulation layer 350, the first electrode 410 may not directly contact the active layer 330. That is, the first electrode 410 may be electrically connected to the active layer 330 through the contact layer 450, and an opening may not be located in the first region I on the active layer 330. The contact layer 450 may include conductive materials.

The active layer 330 may be arranged on a portion of the contact layer 450 and a portion of the gate insulation layer 350 under which the gate electrode 370 is located. In example embodiments, the active layer 330 may include a first end portion and a second end portion that is opposite to the first end portion. The first end portion may be located in the first region I, and the second end portion may be located in the second region II. Here, the first end portion may overlap at least a portion of the contact layer 450. For example, at least a portion of the contact layer 450 may be interposed between the active layer 330 and the gate insulation layer 350. That is, the active layer 330 may directly contact the contact layer 450. The active layer 330 may include a semiconductor oxide layer.

The etching stop layer 390 may be arranged on the gate insulation layer 350 to substantially cover the active layer 330 and the contact layer 450. In example embodiments, the etching stop layer 390 may cover the active layer 330 and the contact layer 450, and may have a substantially uniform thickness along a profile of the active layer 330 and the contact layer 450. Here, the etching stop layer 390 may have the first opening 475 and the second opening 485. The first opening 475 may be located on the contact layer 450, and the second opening 485 may be located on the second end portion of the active layer 330. The first opening 475 may expose a portion of the contact layer 450 in the first region I. The second opening 485 may expose a portion of the active layer 330 in the second region II. The etching stop layer 390 may include silicon compound, metal oxide, etc.

The first electrode 410 and the second electrode 430 may be spaced apart from each other, and may be arranged on the etching stop layer 390. The first electrode 410 may be arranged in the first region I. The first electrode 410 may fill the first opening 475, such that the first electrode 410 contacts the contact layer 450. In example embodiments, the first electrode 410 may be a source electrode. The second electrode 430 may be located in the second region II. The second electrode 430 may fill the second opening 485, such that the second electrode 430 contacts the second end portion of the active layer 330. In example embodiments, the second electrode 430 may be a drain electrode. Each of the first electrode 410 and the second electrode 430 may include metal, alloy, metal nitride, conductive metal oxide, transparent conductive materials, etc. The first electrode 410 may be electrically connected to the active layer 330 through the contact layer 450. A high power supply voltage is applied to the first electrode 410, and the high power supply voltage applied to the first electrode 410 may be provided to the second electrode 430 through the contact layer 450 and the active layer 330. In example embodiments, at least a portion of the contact layer 450 may be interposed between the active layer 330 and the gate insulation layer 350. The first electrode 410 may not directly contact the active layer 330. Thus, the dry or wet etching process may not be performed in the first region I on the active layer 330, and a phenomenon where electrons are trapped may be not generated because an opening is not located in the first region I on the active layer 330. Accordingly, as the semiconductor element 300 includes the contact layer 450, reliability and stability of the semiconductor element 100 may be improved.

Figure 4:
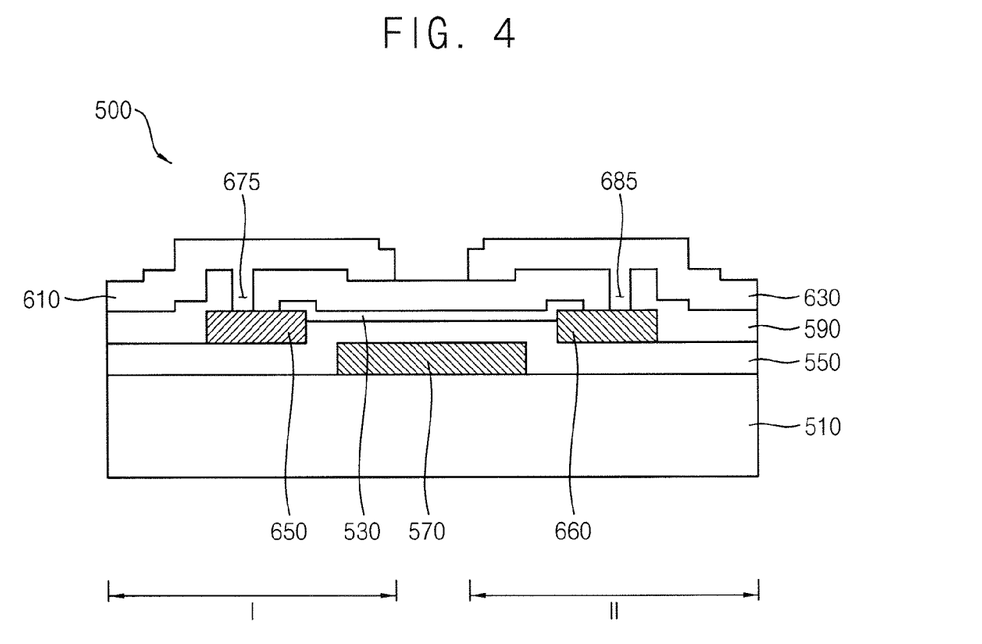
FIG. 4 is a cross-sectional view illustrating a semiconductor element in accordance with some example embodiments.

FIG. 4 is a cross-sectional view illustrating a semiconductor element in accordance with some example embodiments. A semiconductor element 500 illustrated in FIG. 4 may have a configuration that is substantially the same as or similar to that of the semiconductor element 100 described with reference to FIG. 1 except for first and second contact layers 650 and 660. Detailed descriptions of elements which are substantially the same as or similar to the elements described with reference to FIG. 1 may be omitted.

Referring to FIG. 4, a semiconductor element 500 may include a substrate 510, a gate electrode 570, a gate insulation layer 550, a first contact layer 650, a second contact layer 660, an active layer 530, an etching stop layer 590, a first electrode 610, a second electrode 630, etc. Here, the etching stop layer 590 may include a first opening 675 and a second opening 685. In example embodiments, the semiconductor element 500 may include a first region I and a second region II. Each of the first and second contact layers 650 and 660 may be arranged in the first region I and the second region II, respectively. The first contact layer 650 may contact the first electrode 610 through the first opening 675. The first electrode 610 may be electrically connected to the active layer 530 through the first contact layer 650. In addition, the second contact layer 660 may contact the second electrode 630 through the second opening 685. The second electrode 630 may be electrically connected to the active layer 530 through the second contact layer 660. That is, the first electrode 610 and the second electrode 630 may not directly contact the active layer 530, and the openings may not be located on the active layer 530 in the first region I and the second region II.

The first contact layer 650 may be located in the first region I on the gate insulation layer 550. In example embodiments, a thickness of the first contact layer 650 may be relatively greater than that of the gate insulation layer 550. As the first contact layer 650 is located in the first region I on the gate insulation layer 550, the first electrode 610 may not directly contact the active layer 530. That is, the first electrode 610 may be electrically connected to the active layer 530 through the first contact layer 650, and an opening may not be located in the first region I on the active layer 530. The second contact layer 660 may be located in the second region II on the gate insulation layer 550. In example embodiments, a thickness of the second contact layer 660 may be relatively greater than that of the gate insulation layer 550. Because the second contact layer 660 is located in the second region II on the gate insulation layer 550, the second electrode 630 may not directly contact the active layer 530. That is, the second electrode 630 may be electrically connected to the active layer 530 through the second contact layer 660, and an opening may not be located in the second region II on the active layer 530. Each of the first contact layer 650 and the second contact layer 660 may include conductive materials.

The active layer 530 may be arranged on a portion of the first contact layer 650, a portion of the second contact layer 660, and a portion of the gate insulation layer 550 under which the gate electrode 570 is located. In example embodiments, the active layer 530 may include a first end portion and a second end portion that is opposite to the first end portion. The first end portion may be located in the first region I, and the second end portion may be located in the second region II. Here, the first end portion may overlap at least a portion of the first contact layer 650. For example, at least a portion of the first contact layer 650 may be interposed between the active layer 530 and the gate insulation layer 550. That is, the active layer 530 may directly contact the first contact layer 650. In addition, the second end portion may overlap at least a portion of the second contact layer 660. That is, the active layer 530 may directly contact the second contact layer 660. The active layer 530 may include a semiconductor oxide layer.

The etching stop layer 590 may be arranged on the gate insulation layer 550 to substantially cover the active layer 530, the first contact layer 650, and the second contact layer 660. In example embodiments, the etching stop layer 590 may cover the active layer 530, the first contact layer 650, and the second contact layer 660, and may have a substantially uniform thickness along a profile of the active layer 530, the first contact layer 650, and the second contact layer 660. Here, the etching stop layer 590 may have the first opening 675 and the second opening 685. The first opening 675 may be located on the first contact layer 650, and the second opening 685 may be located on the second contact layer 660. The first opening 675 may expose a portion of the first contact layer 650 in the first region I. The second opening 685 may expose a portion of the second contact layer 660 in the second region II. The etching stop layer 590 may include silicon compound, metal oxide, etc.

The first electrode 610 and the second electrode 630 may be spaced apart from each other, and may be arranged on the etching stop layer 590. The first electrode 610 may be located in the first region I. The first electrode 610 may fill the first opening 675, such that the first electrode 610 contacts the first contact layer 650. The second electrode 630 may be located in the second region II. The second electrode 630 may fill second opening 685, such that the second electrode 630 contacts the second contact layer 660. Each of the first electrode 610 and the second electrode 630 may include metal, alloy, metal nitride, conductive metal oxide, transparent conductive materials, etc. The first electrode 610 may be electrically connected to the active layer 530 through the first contact layer 650, and the second electrode 630 may be electrically connected to the active layer 530 through the second contact layer 660. In this case, the dry or wet etching process may not be performed in the first region I and the second region II on the active layer 530, and a phenomenon where electrons are trapped may be not generated because the openings are not located in the first region I and the second region II on the active layer 530. In addition, since the semiconductor element 500 includes the first contact layer 650 and the second contact layer 660, both the first electrode 610 and the second electrode 630 may serve as a source electrode to which a high power supply voltage is applied. Accordingly, as the semiconductor element 500 includes the first contact layer 650 and the second contact layer 660, the semiconductor element 500 may serve as a semiconductor element where the position of the source and drain electrodes are not limited.

Figure 5:
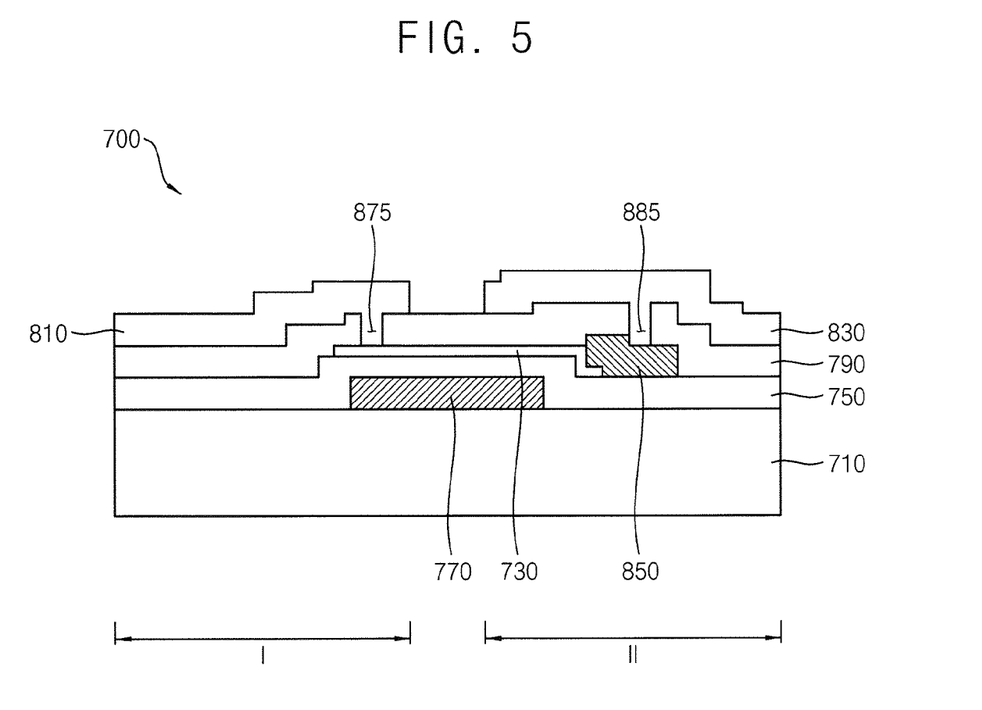
FIG. 5 is a cross-sectional view illustrating a semiconductor element in accordance with some example embodiments.

FIG. 5 is a cross-sectional view illustrating a semiconductor element in accordance with some example embodiments. A semiconductor element 700 illustrated in FIG. 5 may have a configuration that is substantially the same as or similar to that of the semiconductor element 100 described with reference to FIG. 1 except for the position of contact layer 850. Detailed descriptions of elements which are substantially the same as or similar to the elements described with reference to FIG. 1 may be omitted.

Referring to FIG. 5, a semiconductor element 700 may include a substrate 710, a gate electrode 770, a gate insulation layer 750, a contact layer 850, an active layer 730, an etching stop layer 790, a first electrode 810, a second electrode 830, etc. Here, the etching stop layer 790 may include a first opening 875 and a second opening 885. In example embodiments, the semiconductor element 700 may include a first region I and a second region II. The contact layer 850 may be located in the second region II. The contact layer 850 may contact the second electrode 830 through the second opening 885. The second electrode 830 may be electrically connected to the active layer 730 through the contact layer 850. That is, the second electrode 810 may not directly contact the active layer 730, and an opening may not be located on the active layer 730 in the second region II.

The active layer 730 may be arranged on a portion of the gate insulation layer 750 under which the gate electrode 770 is located. In example embodiments, the active layer 730 may include a first end portion and a second end portion that is opposite to the first end portion. The first end portion may be located in the first region I, and the second end portion may be located in the second region II. Here, the second end portion may overlap at least a portion of the contact layer 850. For example, at least a portion of the contact layer 850 may be interposed between the active layer 730 and the etching stop layer 790. That is, the active layer 730 may directly contact the contact layer 850. The active layer 730 may include a semiconductor oxide layer.

The contact layer 850 may be arranged in the second region II on the gate insulation layer 750 and the second end portion. In example embodiments, a thickness of the contact layer 850 may be relatively greater than that of the gate insulation layer 750. Because the contact layer 850 is located in the second region II on the gate insulation layer 750 and the second end portion, the second electrode 830 may not directly contact the active layer 730. That is, the second electrode 830 may be electrically connected to the active layer 730 through the contact layer 850, and an opening may not be located in the second region II on the active layer 730. The contact layer 850 may include conductive materials.

The etching stop layer 790 may be arranged on the gate insulation layer 750 to substantially cover the active layer 730 and the contact layer 850. In example embodiments, the etching stop layer 790 may cover the active layer 730 and the contact layer 850, and may have a substantially uniform thickness along a profile of the active layer 730 and the contact layer 850. Here, the etching stop layer 790 may have the first opening 875 and the second opening 885. The first opening 875 may be located on the first end portion of the active layer 730, and the second opening 885 may be located on the contact layer 850. The first opening 875 may expose the first end portion of the active layer 730 in the first region I. The second opening 885 may expose a portion of the contact layer 850 in the second region II. The etching stop layer 790 may include silicon compound, metal oxide, etc.

The first electrode 810 and the second electrode 830 may be spaced apart from each other, and may be arranged on the etching stop layer 790. The first electrode 810 may be located in the first region I. The first electrode 810 may fill the first opening 875, such that the first electrode 810 contacts the first end portion of the active layer 730. In example embodiments, the first electrode 810 may be a drain electrode. The second electrode 830 may be located in the second region II. The second electrode 830 may fill the second opening 885, such that the second electrode 830 contacts the contact layer 850. In example embodiments, the second electrode 830 may be a source electrode. Each of the first electrode 810 and the second electrode 830 may include metal, alloy, metal nitride, conductive metal oxide, transparent conductive materials, etc. The second electrode 830 may be electrically connected to the active layer 730 through the contact layer 850. A high power supply voltage is applied to the second electrode 830, and the high power supply voltage applied to the second electrode 830 may be provided to the first electrode 810 through the contact layer 850 and the active layer 730. In example embodiments, at least a portion of the contact layer 850 may be interposed between the active layer 730 and the etching stop layer 790. The second electrode 830 may not directly contact the active layer 730. Thus, the dry or wet etching process may not be performed in the second region II on the active layer 730, and a phenomenon where electrons are trapped may be not generated because an opening is not located in the second region II on the active layer 730. Accordingly, as the semiconductor element 700 includes the contact layer 850, reliability and stability of the semiconductor element 100 may be improved.

Figure 6:
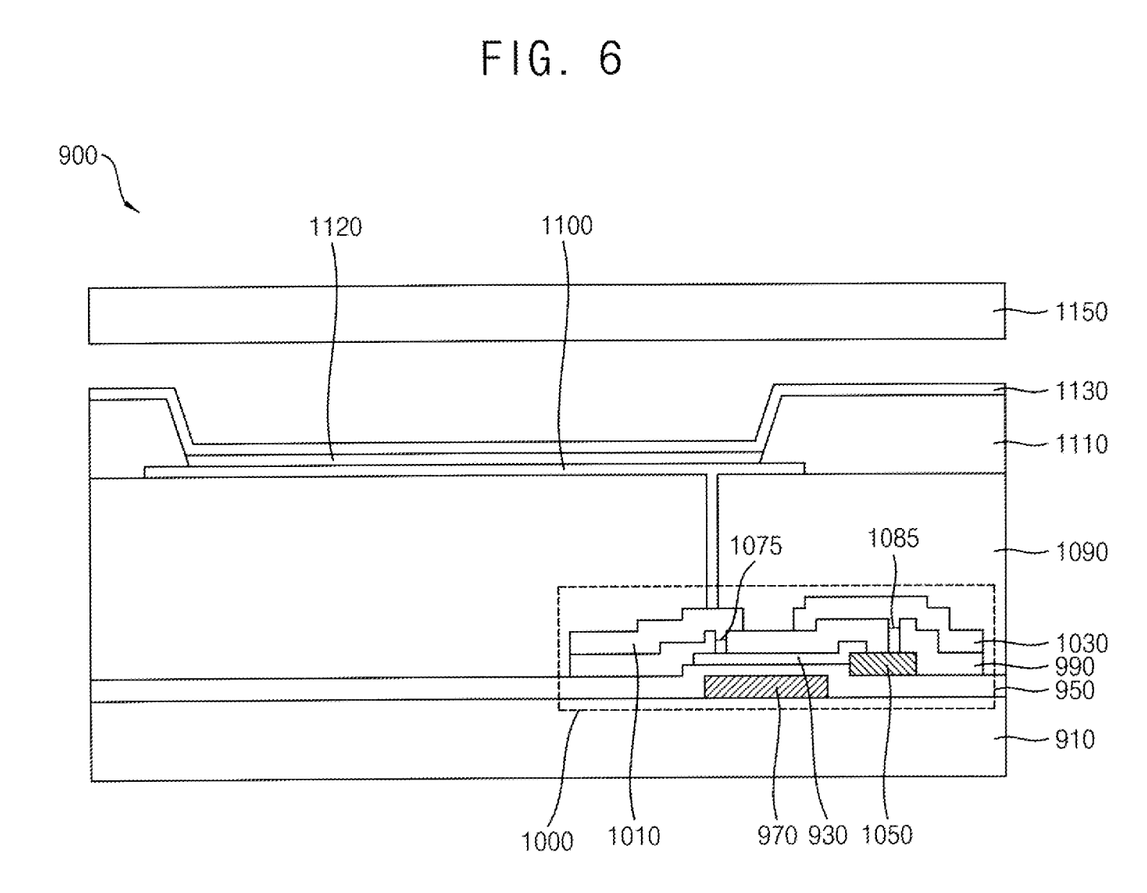
FIG. 6 is a cross-sectional view illustrating an organic light emitting display device in accordance with example embodiments.

FIG. 6 is a cross-sectional view illustrating an organic light emitting display device in accordance with example embodiments. A semiconductor element 1000 illustrated in FIG. 6 may have a configuration that is substantially the same as or similar to that of the semiconductor element 100 described with reference to FIG. 1. Detailed descriptions of elements which are substantially the same as or similar to the elements described with reference to FIG. 1 may be omitted.

Referring to FIG. 6, an organic light emitting display (OLED) device 900 may include a semiconductor element 1000, substrate 910, a planarization layer 1090, a lower electrode 1100, a light emitting layer 1120, an upper electrode 1130, a pixel defining layer 1110, and an encapsulation substrate 1150. Here, the semiconductor element 1000 may include a gate electrode 970, a gate insulation layer 950, a contact layer 1050, an active layer 930, an etching stop layer 990, a first electrode 1010, a second electrode 1030, etc. The etching stop layer 990 may have a first opening 1075 and a second opening 1085. The contact layer 1050 may contact the second electrode 1030 through the second opening 1085, and the second electrode 1030 may be electrically connected to the active layer 930 through the contact layer 1050. That is, the second electrode 1030 may not directly contact the active layer 930, and an opening is not located on the active layer 930.

The semiconductor element 1000 may be arranged on the substrate 910. The substrate 910 may include transparent materials. For example, the substrate 910 may include quartz, synthetic quartz, calcium fluoride, fluoride-doping quartz, a sodalime glass, a non-alkali glass, etc. Alternatively, the substrate 910 may include a flexible transparent resin substrate, such as, for example, a polyimide substrate. The polyimide substrate may include a first polyimide layer, a barrier film layer, a second polyimide layer, etc. When the polyimide substrate is thin and flexible, the polyimide substrate may be formed on a rigid glass substrate to help support the formation of the light emitting structures (e.g., the semiconductor element 1000, the planarization layer 1090, the lower electrode 1100, the light emitting layer 1120, the upper electrode 1130, the pixel defining layer 1110, and the encapsulation substrate 1150). That is, in example embodiments, the substrate 910 may have a structure in which the first polyimide layer, the barrier film layer and the second polyimide layer are stacked on a glass substrate. Here, after an insulation layer is provided on the second polyimide layer, the light emitting structures may be arranged on the insulation layer. After the light emitting structures are formed on the insulation layer, the glass substrate may be removed. It may be difficult to form the light emitting structures directly on the polyimide substrate because the polyimide substrate is thin and flexible. Accordingly, the light emitting structures may be formed on a rigid glass substrate, and then the polyimide substrate may serve as the substrate 910 after removal of the glass substrate.

A buffer layer may be arranged between the substrate 910 and the semiconductor element 1000. The buffer layer may cover the substrate 910. The buffer layer may prevent the diffusion (e.g., an out gassing) of metal atoms and/or impurities from the substrate 910. In addition, the buffer layer may improve a surface flatness of the substrate 910 when a surface of the substrate 910 is relatively irregular. According to a type of the substrate 910, at least two buffer layers may be provided on the substrate 910, or the buffer layer may be omitted.

The planarization layer 1090 may be arranged on the substrate 910 and the semiconductor element 1000. The planarization layer 1090 may cover the substrate 910 and the semiconductor element 1000, and may be arranged on the entire (or substantially entire) substrate 910. The planarization layer 1090 may sufficiently cover the semiconductor element 1000, and have a substantially level surface without a step around the semiconductor element 1000. The planarization layer 1090 may include silicon compound, metal oxide, etc. For example, the planarization layer 1090 may include silicon oxide, silicon nitride, silicon oxynitride, aluminum oxide, tantalum oxide, hafnium oxide, zirconium oxide, titanium oxide, etc.

The lower electrode 1100 may be arranged on the planarization layer 1090. The lower electrode 1100 may contact the first electrode 1010 because a corresponding portion of the planarization layer 1090 has been removed. For example, an opening is formed in the planarization layer 1090 such that the lower electrode 1100 contacts the first electrode 1010. In example embodiments, a high power supply voltage is applied to the second electrode 1030, and the high power supply voltage applied to the second electrode 1030 (which may be transparent member in some embodiments) may be provided to the lower electrode 1100 through the contact layer 1050, the active layer 930, and the first electrode 1010. The lower electrode 1100 may include metal, alloy, metal nitride, conductive metal oxide, transparent conductive materials, etc.

The pixel defining layer 1110 may be arranged on the planarization layer 1090, and may expose a portion of the lower electrode 1100. The pixel defining layer 1110 may include organic materials and/or inorganic materials. In this case, the light emitting layer 1120 may be arranged on the lower electrode 1100 exposed by the pixel defining layer 1110.

The light emitting layer 1120 may be arranged on the exposed portion of the lower electrode 1100. The light emitting layer 1120 may be formed using light emitting materials capable of generating different colors of light (e.g., a red color of light, a blue color of light, and a green color of light).

The upper electrode 1130 may be arranged on the pixel defining layer 1110 and the light emitting layer 1120. The upper electrode 1130 may cover the pixel defining layer 1110 and the light emitting layer 1120, and may be arranged on the entire (or substantially entire) substrate 910. The upper electrode 1130 may include metal, alloy, metal nitride, conductive metal oxide, a transparent conductive material, etc. These may be used alone or in a suitable combination thereof.

The encapsulation substrate 1150 may be arranged on the upper electrode 1130. The encapsulation substrate 1150 and the substrate 910 may include substantially the same materials. For example, the encapsulation substrate 1150 may include quartz, synthetic quartz, calcium fluoride, fluoride-doping quartz, sodalime glass, non-alkali glass, etc. In some example embodiments, the encapsulation substrate 1150 may include a transparent inorganic material and/or a flexible plastic. For example, the encapsulation substrate 1150 may include a flexible transparent resin substrate. To increase flexibility of the OLED device 900, the encapsulation substrate 1150 may include a stacked structure where at least one organic layer and at least one inorganic layer are alternately (or repeatedly) stacked.

The embodiments of the present invention may be applied to various display devices including a semiconductor element. For example, the embodiments of the present invention may be applied to a mobile phone, a smart phone, a smart pad, a laptop computer, a tablet computer, a personal digital assistant (PDA), a portable multimedia player (PMP), a digital camera, a music player (e.g., a MP3 player), a portable game console, a navigation, etc.

The foregoing is illustrative of example embodiments and is not to be construed as limiting thereof. Although a few example embodiments have been described, those skilled in the art will readily appreciate that many modifications are possible in the example embodiments without materially departing from the novel teachings and features of the present inventive concept. Accordingly, all such modifications are intended to be included within the scope of the present inventive concept as defined in the claims. Therefore, it is to be understood that the foregoing is illustrative of various example embodiments and is not to be construed as limited to the specific example embodiments disclosed, and that modifications to the disclosed example embodiments, as well as other example embodiments, are intended to be included within the scope of the appended claims and their equivalents.

What is claimed is:

1. A semiconductor element comprising:
a substrate;
a gate electrode on the substrate;
a gate insulation layer on the gate electrode such that the gate electrode is between the substrate and the gate insulation layer;
an active layer on the gate insulation layer, the active layer comprising a first end portion and a second end portion that is opposite the first end portion;
a contact layer overlapping the second end portion of the active layer;
a first electrode contacting the first end portion; and
a second electrode spaced from the first electrode and from the active layer, the second electrode contacting the contact layer.

2. The semiconductor element of claim 1, wherein the second electrode is electrically connected to the active layer through the contact layer.

3. The semiconductor element of claim 1, wherein the active layer comprises an oxide semiconductor layer.

4. The semiconductor element of claim 1, wherein the contact layer comprises one or more conductive materials.

5. The semiconductor element of claim 1, further comprising an etching stop layer on the gate insulation layer,
wherein the etching stop layer has:
a first opening at the first end portion of the active layer; and
a second opening at the contact layer.

6. The semiconductor element of claim 5, wherein the first electrode contacts the active layer through the first opening, and the second electrode contacts the contact layer through the second opening.

7. The semiconductor element of claim 5, wherein at least a portion of the contact layer is interposed between the active layer and the etching stop layer, and the contact layer is electrically connected with the active layer.

8. The semiconductor element of claim 1, wherein at least a portion of the contact layer is interposed between the active layer and the gate insulation layer, and the contact layer is electrically connected with the active layer.

9. The semiconductor element of claim 1, wherein a high power supply voltage is applied to the second electrode, and the high power supply voltage applied to the second electrode is provided to the first electrode through the contact layer and the active layer.

10. A semiconductor element comprising:
a substrate;
a gate electrode on the substrate;
a gate insulation layer on the gate electrode such that the gate electrode is between the substrate and the gate insulation layer;
an active layer on the gate insulation layer, the active layer comprising a first end portion and a second end portion that is opposite the first end portion;
a first contact layer overlapping the first end portion of the active layer;
a second contact layer overlapping the second end portion of the active layer;
a first electrode contacting the first contact layer;
a second electrode spaced from the first electrode, the second electrode contacting the second contact layer; and
an etching stop layer on the gate insulation layer, the etching stop layer having a first opening adjacent the first end portion of the active layer and a second opening adjacent the second end portion of the active layer, at least one of the first opening and the second opening being outside of a periphery of the active layer.

11. The semiconductor element of claim 10, wherein the first electrode is electrically connected to the active layer through the first contact layer, and the second electrode is electrically connected to the active layer through the second contact layer.

12. The semiconductor element of claim 10, wherein the active layer comprises an oxide semiconductor, and the first and second contact layers comprise one or more conductive materials.

13. The semiconductor element of claim 10,
wherein the first electrode contacts the first contact layer through the first opening, and the second electrode contacts the second contact layer through the second opening.

14. The semiconductor element of claim 10, wherein each of at least a portion of the first and second contact layers is interposed between the active layer and the gate insulation layer, and the first and second contact layers are electrically connected with the active layer.

15. An organic light emitting display device comprising:
a semiconductor element comprising:
a substrate;
a gate electrode on the substrate;
a gate insulation layer on the gate electrode such that the gate electrode is between the substrate and the gate insulation layer;
an active layer on the gate insulation layer, the active layer comprising a first end portion and a second end portion that is opposite the first end portion;
a contact layer overlapping the second end portion of the active layer;
a first electrode contacting the first end portion; and
a second electrode spaced from the first electrode and from the active layer, the second electrode contacting the contact layer,
a lower electrode electrically connected to the first electrode;
a light emitting layer on the lower electrode; and
an upper electrode on the light emitting layer.

16. The organic light emitting display device of claim 15, wherein the second electrode is electrically connected to the active layer through the contact layer, and
wherein the active layer comprises an oxide semiconductor, and the contact layer comprises conductive materials.

17. The organic light emitting display device of claim 15, further comprising an etching stop layer on the gate insulation layer,
wherein the etching stop layer has:
a first opening at the first end portion of the active layer; and
a second opening at the contact layer, and wherein the first electrode contacts the active layer through the first opening, and the second electrode contacts the contacts layer through the second opening.

18. The organic light emitting display device of claim 15, further comprising a planarization layer on the semiconductor element,
wherein the planarization layer has a third opening that exposes at least a portion of the first electrode, and the lower electrode contacts the first electrode through the third opening.

19. The organic light emitting display device of claim 15, wherein at least a portion of the contact layer is interposed between the active layer and the gate insulation layer, and the contact layer is electrically connected with the active layer.

20. The organic light emitting display device of claim 15, wherein a high power supply voltage is applied to the second electrode, and the high power supply voltage applied to the second electrode is provided to the lower electrode through the contact layer, the active layer, and the first electrode.

* * * * *